United States Patent [19]
Bareket

[11] Patent Number: 6,079,256
[45] Date of Patent: Jun. 27, 2000

[54] OVERLAY ALIGNMENT MEASUREMENT OF WAFERS

[75] Inventor: Noah Bareket, Saratoga, Calif.

[73] Assignee: KLA Instruments Corporation, San Jose, Calif.

[21] Appl. No.: 09/207,158

[22] Filed: Dec. 7, 1998

Related U.S. Application Data

[62] Division of application No. 08/680,592, Jul. 12, 1996, Pat. No. 6,025,338.

[51] Int. Cl.[7] .............................. G01B 5/28; G01B 7/34
[52] U.S. Cl. ............................ 73/105; 250/306; 250/307
[58] Field of Search .................................... 73/1.79, 1.81, 73/105; 250/306, 307

[56] References Cited

U.S. PATENT DOCUMENTS

| | | | |
|---|---|---|---|
| 3,505,861 | 4/1970 | Schoefer et al. | 73/105 |
| 4,480,916 | 11/1984 | Bareket et al. | 356/351 |
| 5,533,387 | 7/1996 | Aihara et al. | 73/105 |
| 5,633,455 | 5/1997 | Quate | 73/105 |

OTHER PUBLICATIONS

Modern Optical Engineering, The Design of Optical Systems, Warren J. Smith, (1990) 2nd Ed., pp. 151–154.

Handbook of Critical Dimension Metrology and Process Control, Kevin M. Monahan, editor, (1994) vol. CR52, pp. 160–188.

*Primary Examiner*—Daniel S. Larkin
*Attorney, Agent, or Firm*—Allston L. Jones

[57] ABSTRACT

The present invention is a method and apparatus that uses a microscopic height variation positioned relative to a semiconductor device to scan a target on the device to produce an electrical signal representative of height variations of first and second periodic structures of the target in a selected path across the device, and a computing and control system to provide translation between the microscopic height variation detector and the target on the device in a selected path, and to calculate any offset between the first periodic structure and the second periodic structure of the target from the electrical signals from the microscopic height variation detector. The first periodic structure of the target is on a first layer of the device, and the second periodic structure, that complements the first periodic structure, is on a second layer of the device at a location that is adjacent the first periodic structure.

6 Claims, 13 Drawing Sheets

OVERLAY ALIGNMENT MEASUREMENT OF WAFERS

This is a divisional of application(s), Serial No. 08/680,592, filed on Jul. 12, 1996, U.S. Pat. No. 6,025,338.

FIELD OF THE INVENTION

The present invention relates to the measurement of the alignment of two successive layers on a semiconductor wafer during the production of the wafer. More specifically to the use of a new alignment pattern and corresponding measurement instruments to determine the registration accuracy between the two successive thin film layers on a semiconductor wafer.

BACKGROUND OF THE INVENTION

One of the most critical process control techniques used in the manufacturing of integrated circuits is the measurement of overlay accuracy between successive layers on a wafer (i.e., the determination of how accurately a layer aligns with respect to the layer below it).

Presently, this measurement is done with patterns that are etched into the layers. The relative displacement of the two layers is measured by imaging the patterns at high magnification on an electronic camera and by calculating the image position on the camera using any of a variety of known image analysis algorithms. The most commonly used patterns are concentric squares with dimensions of approximately 20 micrometers on each side, generally referred to as "box within a box" target. This prior art is described and analyzed by Neal T. Sullivan, "Semiconductor Pattern Overlay", in Handbook of Critical Dimensions Metrology and Process Control, pp 160–188, vol. CR52, SPIE Press (1993).

The resulting accuracy of the prior art is therefore limited by the asymmetry of etched line profiles, by aberrations in the illumination and imaging optics, and by image sampling in the camera.

It would be desirable to have a system that overcomes the limitations of the prior art. It is the intent of the present invention to rectify the shortcomings of the prior art in several areas:

1. The present invention illuminates and collects the light over a very narrow field of view, so it does not suffer from off-axis aberrations present in the prior art;

2. The present invention samples the signal at a rate that is as high as necessary to meet the required accuracy (e.g., higher than 1000 samples per micron), while the prior art sampling rate is low (typically less than 10 samples per micron), and limited by the number of pixels in the camera;

3. The alignment requirements for the present invention are loose (on the order of 5 to 10 microns in displacement, and 10 degrees in angle), while the prior art requires high alignment accuracy for repeatable measurements (e.g., 0.1 micron in displacement, 0.01 degrees in angle); and 4. The prior art requires very precise focusing to perform the measurement (about 0.1 micron).

The present invention does not require such focusing accuracy.

SUMMARY OF THE PRESENT INVENTION

The present invention uses a new target pattern, and method and measuring instrument. The target of the present invention is composed of alternating periodic structures on two successive layers of a semiconductor wafer to provide alignment information. The target structures of the present invention are produced by lithographic techniques, and in the simplest implementation includes etched, or deposited, parallel lines with the inter-line spacing being the same as the line width, forming periodic gratings. Alignment information is then obtained by scanning one or more light beams across the two alternating gratings, generating a pair of detected reflected signals representative of the variations in the reflected light from the scanned beams, then by measuring the relative offset, or phase shift, between the detected reflected signals the alignment of the layers can be determined.

BRIEF DESCRIPTION OF THE FIGURES

FIG. 5b illustrates the waveforms produced by the second embodiment alignment measuring system of FIG. 5a.

DETAILED DESCRIPTION OF THE PRESENT INVENTION

Figure 1A:
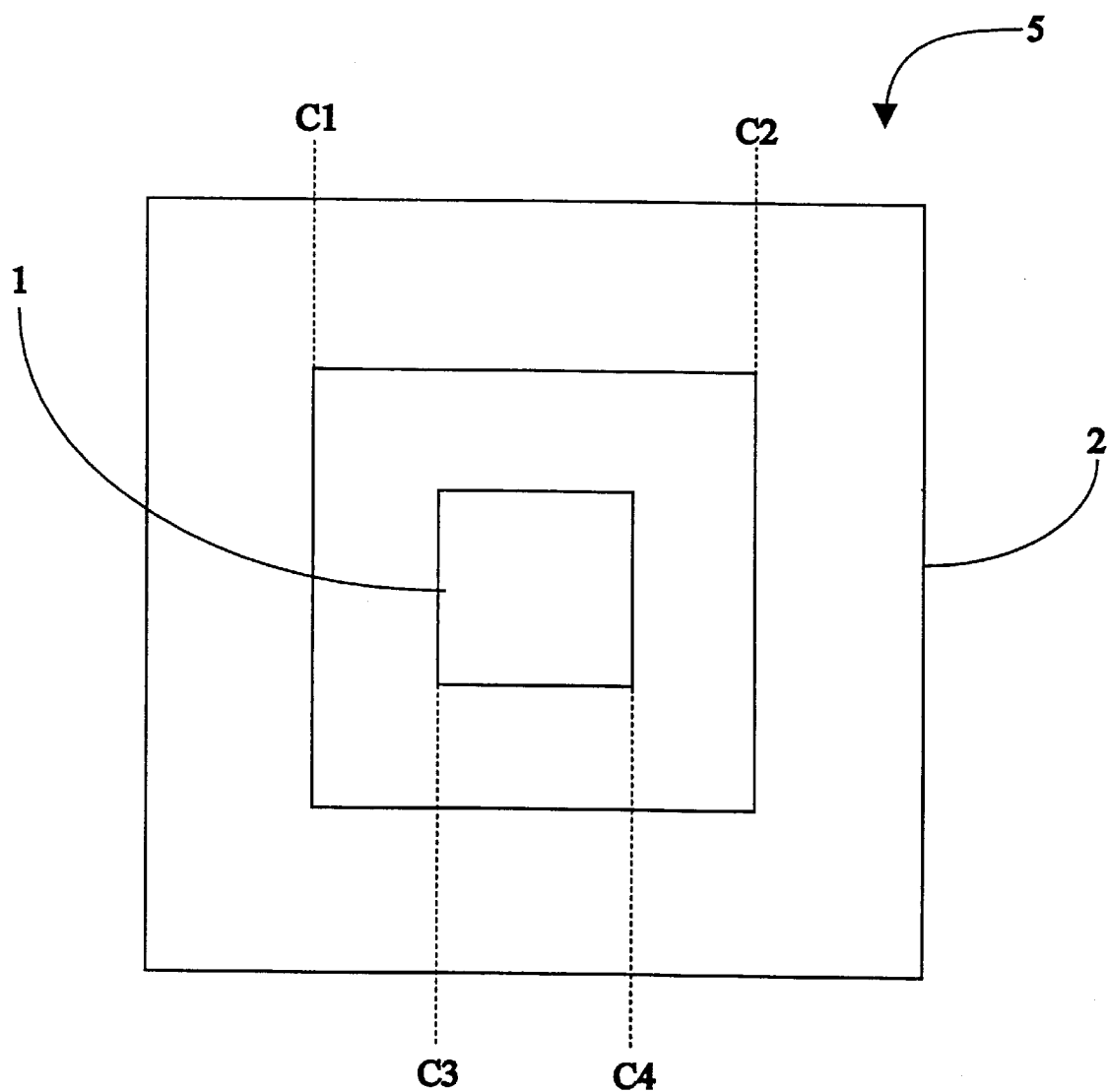
FIG. 1a illustrates a typical prior art "box in a box" target pattern.

The present art of alignment measurement uses a "box in a box" type target 5 that is typically like the one illustrated in FIG. 1a. Inner box 1 is typically printed on the top layer of the semiconductor wafer being produced, while the open-center-outer block 2 is printed on the second layer down on the semiconductor wafer. The measurement process thus involves imaging of target 5 on an electronic camera, by means of a microscope system, at a high magnification (1000×, typically) and with high resolution in both x and y directions.

The registration error in each of the x and y axes is measured by first calculating the locations of the edges of lines c1 and c2 of the outer box 2, and the edge locations of the lines c3 and c4 of the inner box 1. From those locations the misregistration between the two boxes is determined by comparing the average separation between lines c1 and c3 with the average separation between lines c4 and c2 (i.e., the misregistration between boxes 1 and 2 is the difference between those two separations). The misregistration between boxes 1 and 2 in each axis is thus calculated using the following formulas:

$$R_x = (c_x 3 - c_x 1) - (c_x 2 - c_x 4) \tag{1a}$$

and $$R_y = (c_y 3 - c_y 1) - (c_y 2 - c_y 4) \tag{1b}$$

Thus, if the average spacing between lines c1 and c3 is the same as the average spacing between lines c2 and c4, the corresponding value of R in that axis will be zero.

The best practical optical resolution is approximately 1 micron, thus image processing algorithms are needed to estimate the precise location of the boxes, so that the required accuracy of better than 0.01 micron can be obtained.

Figure 1B:
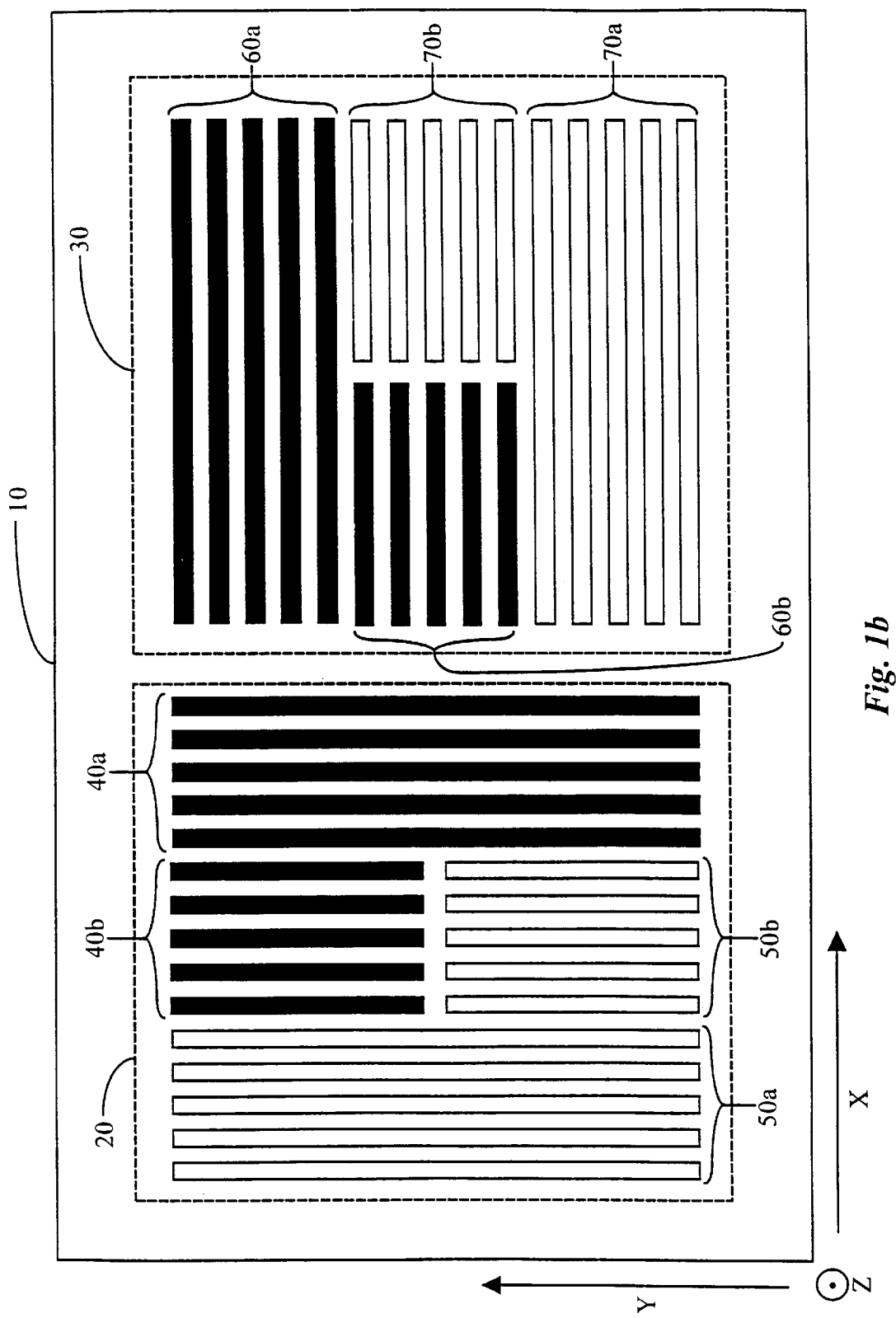
FIG. 1b illustrates an embodiment of the periodic grating of the present invention used to determine the alignment of two layers of a semiconductor.

The present invention, in each of the various embodiments, uses a target that is composed of periodic structures on each of two consecutive layers of a semiconductor device to provide relative position information between those two layers of the semiconductor device. Those structures are produced by suitable lithographic techniques, and in the simplest application constitute etched or deposited lines of an equal width to the distance between the lines, forming a periodic grating as shown in FIG. 1b and discussed in more detail below. One embodiment of the periodic structures (see FIG. 16) consists of equally spaced lines having essentially a square profile with the lines arranged so that there is no overlap between the portions of the periodic structure contributed by each of the two layers. The lines from each layer of the semiconductor device appear side by side in the periodic structure. While a square profile is preferred because it is easily manufactured by lithography means, it is not essential for operation, and other line profiles, trapezoidal or rounded, could alternatively be used. Additionally, while the patterns for both the x- and y-directions are shown side-by-side here, they could be in different locations on the semiconductor wafer if space is limited. This configuration contributes to various embodiments of a comprehensive measuring instrument for overlay alignment of semiconductor layers that are discussed below.

FIG. 1b shows a periodic structure in the form of alignment pattern 10, shown here in perfect alignment between the layers which will become clear from the following discussion. Alignment pattern 10 includes two identical grating patterns, 20 and 30, translated 90° with respect to each other. Given the axis orientation markings in FIG. 1b, left grating 20 is for x-axis registration measurements, while right grating 30 is for y-axis measurements since the lines of the respective grating must be non-parallel to the axis of the measurement to be effective. The user can choose any convenient orientation of the target relative to the placement of the dies on the wafer with that orientation being the same for the masks from layer to layer. Otherwise the orientation of the target and the die patterns on the masks is not critical.

Each of the left and right gratings 20 and 30, as shown in FIG. 1b, consist of four sets of solid parallel line segments with the width of each line equal to the spacing between the line segments. In actual use, the configuration of line-width to spaces will vary, depending on the required accuracy, however that relationship will typically be the minimum linewidth on the semiconductor wafer.

Directing attention to the left grating 20 for illustration, the line segments 40a and 40b, shown in solid outline, are etched on one layer of the semiconductor wafer, while the line segments 50a and 5b, shown in sloid outline (solid in reality), are etched on the subsequent layer of the semiconductor wafer. Additionally, line segments 40a and 50a are full length line segments that are the outer line segments of the grating contributed by each of the semiconductor wafer layers, while the substantially half length line segments 40b and 50b make up the central region of the periodic grating with each set contributed by a different layer of the semiconductor wafer. Note, while line segments 40b and 50b have been shown in FIG. 1b as being substantially half line length segments, segments 40b and 50b could be a selected length of up to one-half the length of line segments 40a and 50a, and thus up to one-half the width of the target. In right grating 30, line segments 60a and 60b are shown corresponding to, and being on the same layer of the semiconductor wafer as, lines 40a and 40b in left grating 20. Similarly, in right grating 30, line segments 70a and 70b are shown corresponding to, and being on the same layer of the semiconductor wafer as lines 50a and 50b in left grating 20. This is for illustration here and need not be matched that way in actual use (i.e., line segments 40a, 40b, 70a and 70b might be on the same layer, while line segments 50a, 50b, 60a and 60b might be on the other layer).

Note, that in FIG. 1b five lines of each length are shown in each grating being contributed by each layer of the semiconductor wafer. The number of lines that are used is dependant on the resolution required and the signal-to-noise ratio that must be overcome. From the perspective of the minimum number of each length of lines that is needed for operation, that number is two "a" and two "b" lines being contributed by each of the two consecutive layers of the semiconductor wafer for each of left and right gratings 20 and 30, respectively. Note additionally, that if the lines shown in solid outline are printed on the first layer of the semiconductor wafer with the lines shown solid on the second layer, then on the third layer another set of lines (shown here in solid outline) are printed over, and covering, the region of lines 50a and 50b of the first layer. Then the lines 40a and 40b of the second layer are used in conjunction with lines 50a and 50b on the third layer. Thus, each set of lines on a layer of the semiconductor wafer (except for those on the first and last layers) are used in conjunction with the lines on two layers of the semiconductor wafer, the one below and the one above. Alternatively, if there is sufficient space on the semiconductor wafer surface, the grating pairs for each pair of adjacent layers on the wafer could be in a different location on the wafer to minimize any "bleed through" interference from a third layer on the measurement for the top two layers of interest.

Thus, given that configuration, any offset between the two layers of the semiconductor wafer in the left grating 20 will be present between the juxtaposed lines of 50a and 50b and 40a and 40b. Similarly, in the right grating any offset will be present between the juxtaposed lines of 60a and 60b and 80a and 80b.

Figure 2:
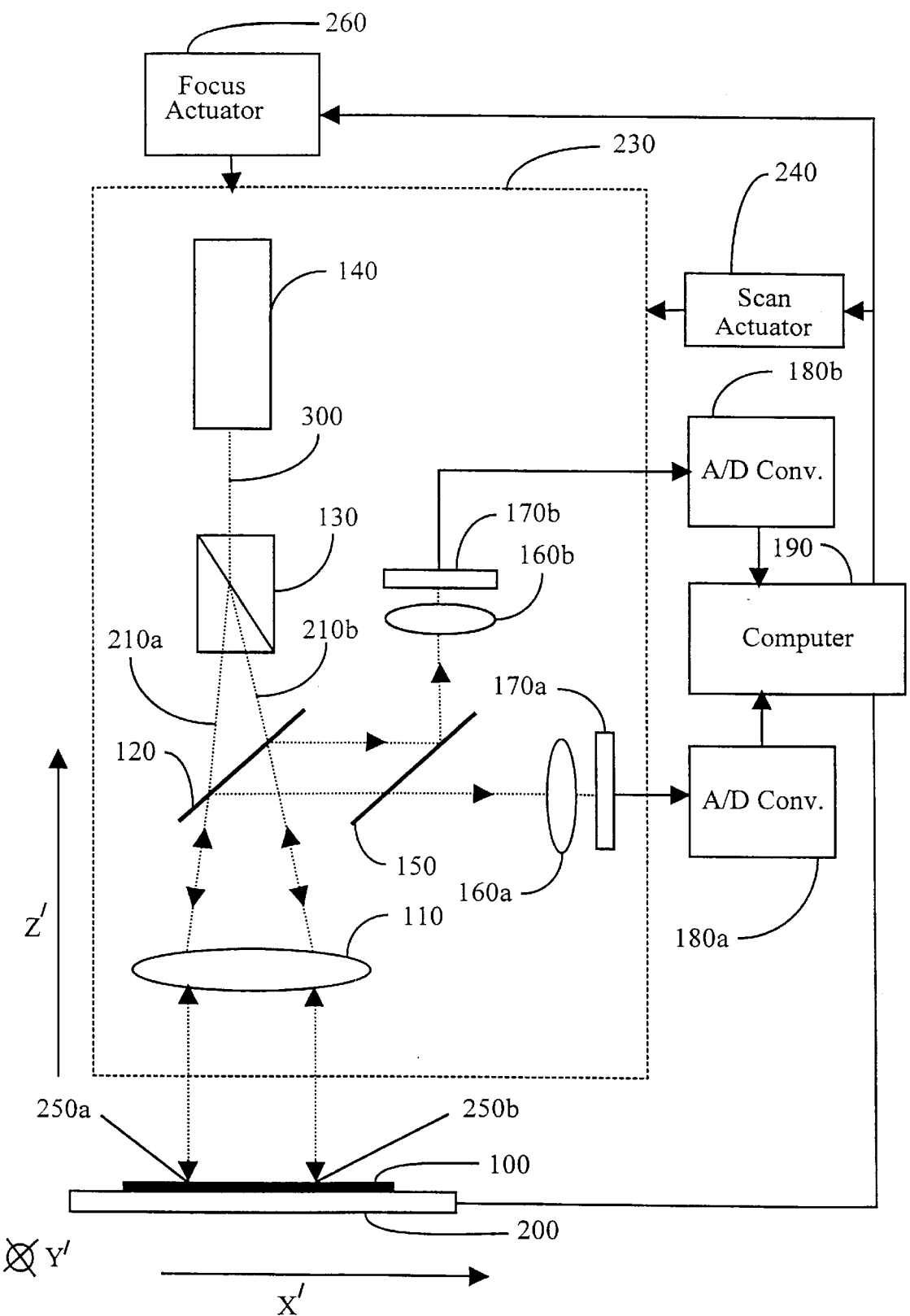
FIG. 2 is a block diagram of an embodiment of an alignment scanner of the present invention to measure the alignment of the layers of a semiconductor wafer.

FIG. 2 is a block diagram of one embodiment of an alignment scanner of the present invention that utilizes an alignment pattern, for example the alignment pattern 10 discussed with respect to FIG. 1*b*. In this embodiment, wafer 100 with the pattern thereon being measured is placed on stage 200 which is typically motor driven under the control of system computer 190 with scan head 230 provided to perform the actual measurements with computer 190 also performing the actual calculations from the data received from scan head 230. There are two options with respect to providing scanning motion between wafer 100 and scan head 230. One is to move stage 200 relative to scan head 230 by computer 190, and the other is to move scan head 230 by computer 190 via scan actuator 240 (e.g., a piezoelectric actuator) relative to stage 200. While either technique can be used, it is preferred to move scan head 230 and hold stage 200 stationary since the scan head can be made much smaller in size and weight relative to the wafer positioning stage. Alternatively, scanning can be implemented by moving the whole head, or by moving only some of the optical components.

Before proceeding with the discussion of the construction and operation of the first embodiment of the present invention shown in FIG. 2, there are a few definitions to be addressed. In FIG. 2, and the figures for each of the other embodiments of the present invention discussed herein, there are two coordinate systems that define the measurement geometry. One is the coordinate axes of wafer 100 which are referred to as x, y, and z (see FIG. 1*b*). The other is the coordinate axes of scan head 230 relative to wafer 100 which is refereed to here as x', y' and z', which are as indicated in FIG. 2.

As shown in FIG. 2, the x' axis is horizontal and in the plane of the figure, the z' axis is vertical and in the plane of the figure, and the y' axis (the axis of the measurement) is perpendicular to and into the plane of the figure. Thus, in this specific example, the measurement is being made on right grating 30 (see FIG. 1*b*). Initially wafer 100 is placed on stage 200 and stage 200 is then aligned by rotating stage 200 so that the x- and y-directions of gratings 20 and 30 on wafer 100 are substantially parallel to the x' and y' axes of scan head 230. If the two axes systems are not exactly aligned then an imaginary line drawn between illuminated spots 250*a* and 250*b* will not be parallel to the axis that is not being measured on wafer 100 (see FIG. 3 where the axis not being measured is the x-axis) and one spot will be slightly advanced along the y-axis with respect to the other in the grating pattern being used to measure alignment.

The optical part of the system of FIG. 2 incorporated within scan head 230 includes light source 140 (e.g., a diode laser, or any coherent or incoherent light source) that directs a beam of light 300 to birefringent polarizing prism 130 (e.g., a Rochon prism) where the light is split into two light beams 210*a* and 210*b*, which are linearly and orthogonally polarized upon emergence from the prism. The prism also introduces a small angular deviation between the direction of propagation of the two beams, which is determined by the prism design.

Figure 3:
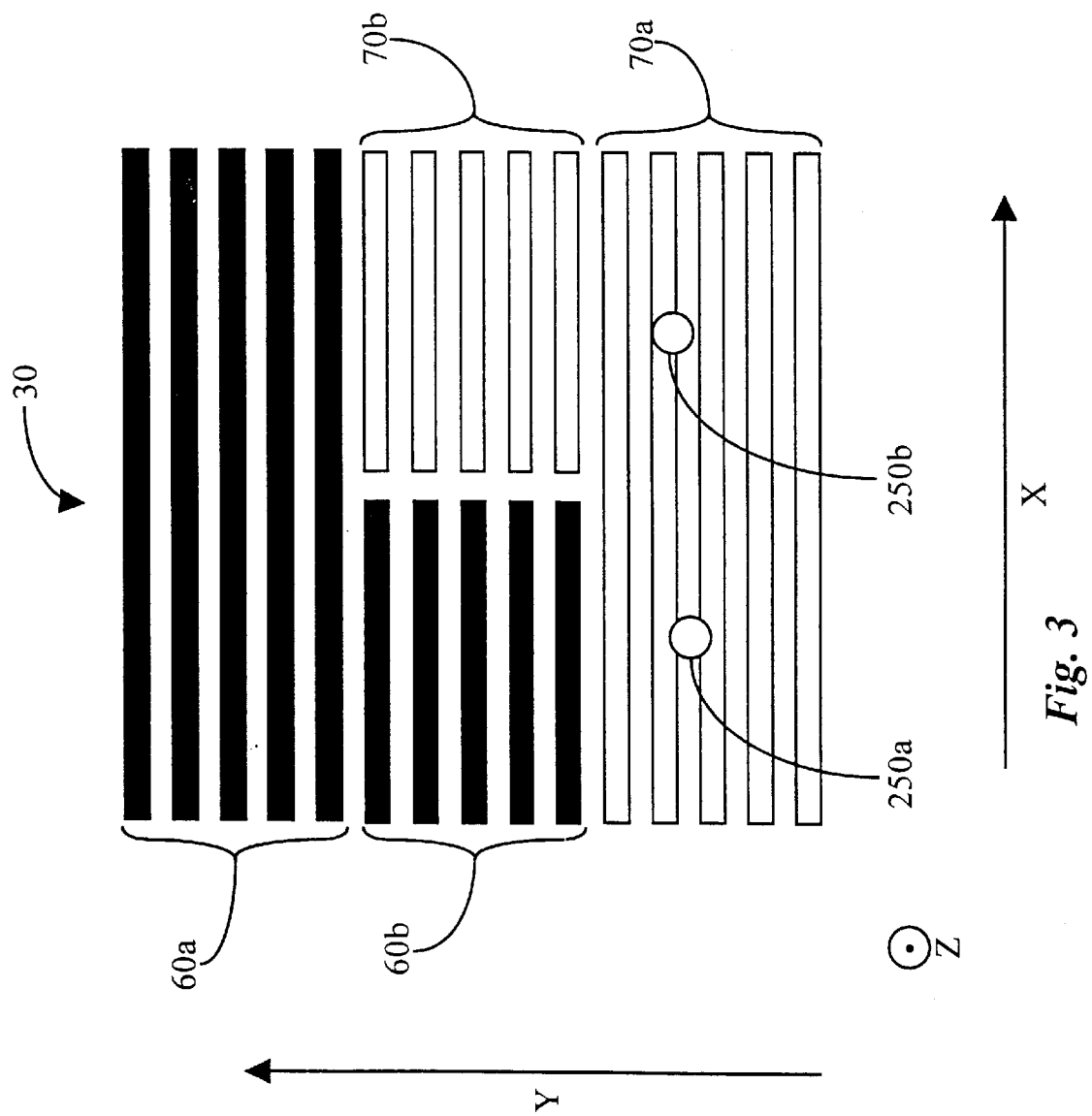
FIG. 3 illustrates an embodiment of an alignment measurement system of the present invention using a periodic grating of the present invention that is perpendicular to the y-axis with an instantaneous position of two light beams used for measurement of alignment in the y-direction.

Light beams 210*a* and 210*b* in turn are directed through non-polarizing first beam splitter 120 that is designed to transmit and reflect light in about equal parts with the two transmitted light beams directed to lens 110 (e.g., a single element or multiple element lens) where the two transmitted light beams are focused by lens 110 at spots 250*a* and 250*b*, on the right grating 30 on wafer 100, as shown in FIG. 3.

The reflected light from each of spots 250*a* and 250*b* on wafer 100 is then collected by lens 110, impinges on the first beam splitter 120 where the light is reflected through substantially 90° to a second beam splitter 150 which is of a polarizing type. Since the reflected light from each of spots 250*a* and 250*b* is essentially preserved in the polarization state, beamsplitter 150 separates the light into transmitted light from one spot, and reflected light from the other. Thus, light reflected from spot 250*a* is shown here passing through second beam splitter 150 to lens 160*a* where it is focused on detector 170*a*. Similarly, the light from spot 250*b* is reflected through approximately 90° by second beam splitter 150 to lens 160*b* and impinges on detector 170*b*.

Each of light detectors 170*a* and 170*b* (e.g., silicon diode detectors or photo-multipliers), in-turn generates an analog electrical signal that is proportional to the intensity of the light received by the respective detector. That analog electrical signal from each of detectors 170*a* and 170*b* is applied to an optional corresponding A/D converter (analog-to-digital converter) 180*a* and 180*b*, respectively, with each resulting digital signal being applied to computer 190. The offset between the two signals is then determined by computer 190 as discussed below in relation to FIG. 4, with that offset being directly proportional to the misalignment between the portions of the -grating pattern on each of the consecutive layers of wafer 100 in the direction in which the measurement was made.

The measurement accuracy is dependent on the intervals at which the signals are sampled by the A/D converters. The sampling interval S (i.e., the distance the spot moves between consecutive samples, in units of length) is calculated as:

$$S = \frac{\text{Scanspeed}}{\text{Frequency}} \qquad (2)$$

Typically, with a scan speed of 10 mm/sec, and digitizing frequency of 1000 samples/sec, the sampling interval is 10 nm with the measurement accuracy getting better as the sampling interval decreases.

To initially focus the light beams on spots 250*a* and 250*b*, scan head 230 can be moved in the z-direction under the control of computer 190 by focus actuator 260 to physically raise and lower scan head 230 as necessary. Also, to measure the x-axis of wafer 100, a second optical system could be employed, wafer 100 could be rot ated 900 relative to light beams 250*a* and 250*b*, or scan head 230 could be rotated through 90°, and the second measurement along the xl-axis made using left grating 20 in the same way as described above for the y'-axis. Typically, scan head 230 is moved with respect to wafer 100 rather than moving stage 200 because the optical scan head can be made to be much smaller and lighter than x-y stage 200.

There are several design considerations that are worth noting. First is that prism 130 polarizes light beam 300 as it is split into two light beams, 210*a* and 210*b*. If the incoming light to prism 130 is polarized in a direction different than 450, the intensity of the two outgoing beams will not be equal, and will vary if the orientation of the polarization of the incoming beam changes. For this reason, circularly polarized light, or un-polarized light in beam 300, is preferred, as it ensures essentially equal energy in the two outgoing beams, 210*a* and 210*b*.

Also, it is desired to have a spot size (defined by the first zeroes of the diffraction limited irradiance pattern) that is about half the period of the gratings (i.e., the line width in alignment pattern 10) so that the modulation of the light by the grating has the highest contrast. The spot size is related to the numerical aperture (NA) of the lens by a fundamental, well known relationship: $D = k\lambda NA$, where k is a constant between 0.6 to 1, $\lambda$ is the wavelength. This consideration defines the desired numerical aperture of the lens.

Figure 4:
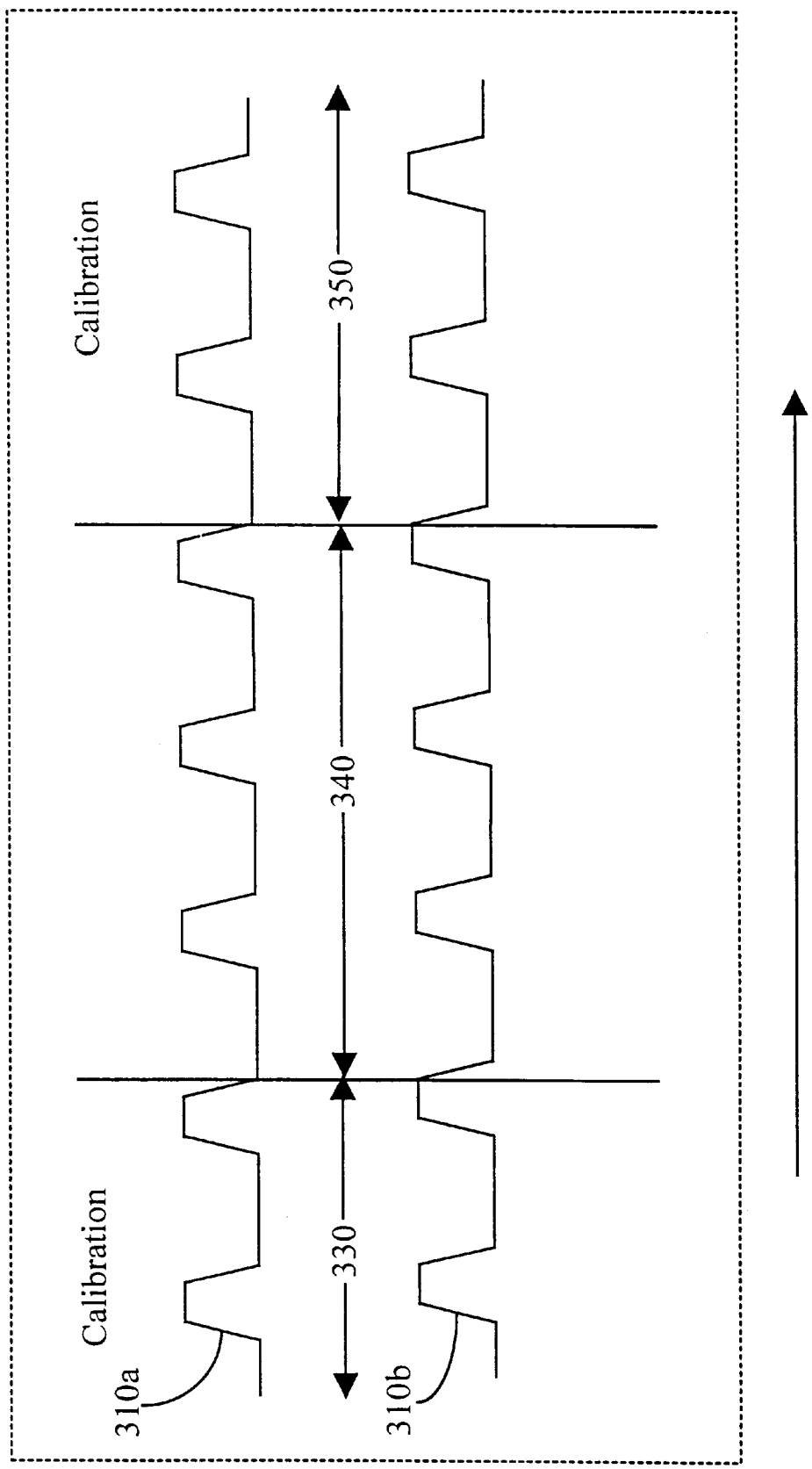
FIG. 4 displays in time and position the relationship of the signals developed by each of the scanned light beams in FIG. 3.

The waveforms that are generated by the measurement process described above are presented schematically in FIG. 4. The waveform 310a corresponds to the output of the digitizer 180a (FIG. 2), and the waveform 310b corresponds to the output of digitizer 180b (FIG. 2). The vertical ax is in FIG. 4 represents the magnitude of the detected light, and the horizontal axis represents elapsed time. Since the scan rate is essentially constant, the elapsed time is proportional to the scan distance, so that the horizontal axis also represents position in the scan direction.

To illustrate how the misalignment between the two layers on wafer 100 is determined, waveforms 310a and 310b in FIG. 4 are drawn for such a misalignment, as well as an offset between the ax es of wafer 100 (x, y, and z) and the axes of scan head 230 (x', y', and z').

The following discussion requires reference to both FIGS. 3 and 4 simultaneously. In FIG. 4, waveforms 310a and 310b are shown in re lation to each other as scan head 230 is advanced across wafer 100 (here oriented along the y-axis). Those waveforms are all shown divided into three segments 330, 340, and 350. Segment 330 represents the signals obtained by scanning lines 70a (see FIG. 3), segment 340 represents the signals obtained by scanning lines 60b and 70b, and segment 350 represents the signals obtained by scanning lines 60a.

The first segment 330 of signals 310a and 310b is a first calibration segment since both signals correspond to a time when both illumination points, 250a and 250b impinge on lines 70a of target 30, as the scan head is translated in the positive y-direction. In segment 330, the relationship of spots 250a and 250b with respect to the measurement axis can be determined since there is no alignment error between lines 70a (i.e., the offset of the axes of the first layer of semiconductor wafer 100 and scan head 230 can be determined with that portion of the grating contributed by the first layer of the semiconductor wafer).

The second segment 340 is a measurement segment since each of signals 310a and 310b are contributed by the scanning of a portion of the two gratings contributed by the two layers of semiconductor wafer 100 (i.e., spot 250a impinges on lines 60b of the second layer and spot 250b impinges on lines 70b of the first layer).

The third segment 350 of signals 310a and 310b is a second calibration segment since both signals are obtained from lines 60a on a second layer of wafer 100 (i.e., both signals correspond to a time when both illumination points, 250a and 250b impinge on lines 60a as scan head 230 is translated in the positive y-direction). In segment 350, the relationship of spots 250a and 250b with respect to the measurement axis can be determined since there is no alignment error between the lines 60a (i.e., the offset of the axes of the second layer of semiconductor wafer 100 and scan head 230 can be determined with that portion of the grating contributed by the second layer of the semiconductor wafer).

It should be noted that if patterns 60a, 60b, and 70a, 70b are perfectly parallel to the x'-axis of scan head 230, and furthermore if illumination points 250a and 250b are on the identical y'-coordinate of scan head 230, then waveforms 310a and 310b will be perfectly in phase during segments 330 and 350 since neither of illumination points 250a and 250b will be advanced ahead of the other (e.g., in FIG. 3 illumination point 250b is shown advanced with respect to illumination point 250a).

The calculations performed by computer 190 consist of a determination of the phase differences during the three segments 330, 340, and 350. The phase differences during segments 330 and 350 are due to the previously explained imperfect rotational alignment of the pattern on wafer 100 and the axes of scan head 230 which produces the different coordinates of illumination points 250a and 250b with respect to the actual axis of wafer 100 in the direction that it is being scanned.

Then, the actual y-axis registration error between the two layers of wafer 100 is the difference between the phase error between waveforms 310a and 310b during segment 340, minus the phase error of the same waveforms during calibration segments 330 and 350. Thus, this two-beam measurement method eliminates common mode errors.

Methods of computing the phase error, or time shift between two waveforms are well established, including Fourier transform algorithms, zero-crossing detection, and others, however cross-correlation algorithms produce excellent results with the present invention when a significant amount of noise is present. The cross-correlation of sampled waveforms is calculated for various integer displacements of the sampling interval of waveforms 310a and 310b. The displacement where the sampled cross-correlations reach the peak is the phase difference, and is determined in segments 330, 340, and 350. The registration error is calculated by D=P•φ, where P is the grating period, and φ is the calibrated phase difference between the two signals, which is given by: $\phi=\phi_b-0.5(\phi_a+\phi_c)$. The parameters of this equation are defined as:

$\phi_a$=the phase difference between signals 310a and 310b during interval 330;

$\phi_b$=the phase difference between the same signals during interval 340; and $\phi_c$=the phase difference between the same signals during interval 350.

In some cases, it may be desirable to make several scans, either at the same x-coordinate, or at different x-coordinates. Several scans are desirable to reduce measurement noise since several measurements are averaged, statistically random noise is reduced. Assuming that a scanning is in the y-axis direction (as described before and indicated in the figure), it is desirable to move the scan line along the x-axis direction so that localized imperfections in the grating structure (which are statistically random) can be averaged. For each scan the registration error is computed in each of segments 330 and 350, and then an average is taken of those values. Computing the registration error and then averaging the registration errors is preferable to averaging the intensity values of each sample point since errors due to vibration cancel out when the samples are taken within a small part of a single cycle of the predominant vibration frequency. From experience, these vibration frequencies when present are typically well below 500 hertz.

The embodiment of FIG. 2 uses an optical head 230 that is moved mechanically by scan actuator 240 so that the light beams scan across the gratings, and as discussed above, one of the technics that can be used to scan wafer 100 in the x' direction is to rotate scan head 230 through 90° and repeat the process described above for the y' axis. In certain applications, however, it may be advantageous to perform the scan without rotating the scan head, or perhaps without having to move either the scan head or the wafer. One way to perform that function is through the use of scanning mirrors (i.e, mirrors that are rotated through a small angle to scan the light beam across the surface of the wafer in the direction of the desired scan).

Figure 7A:
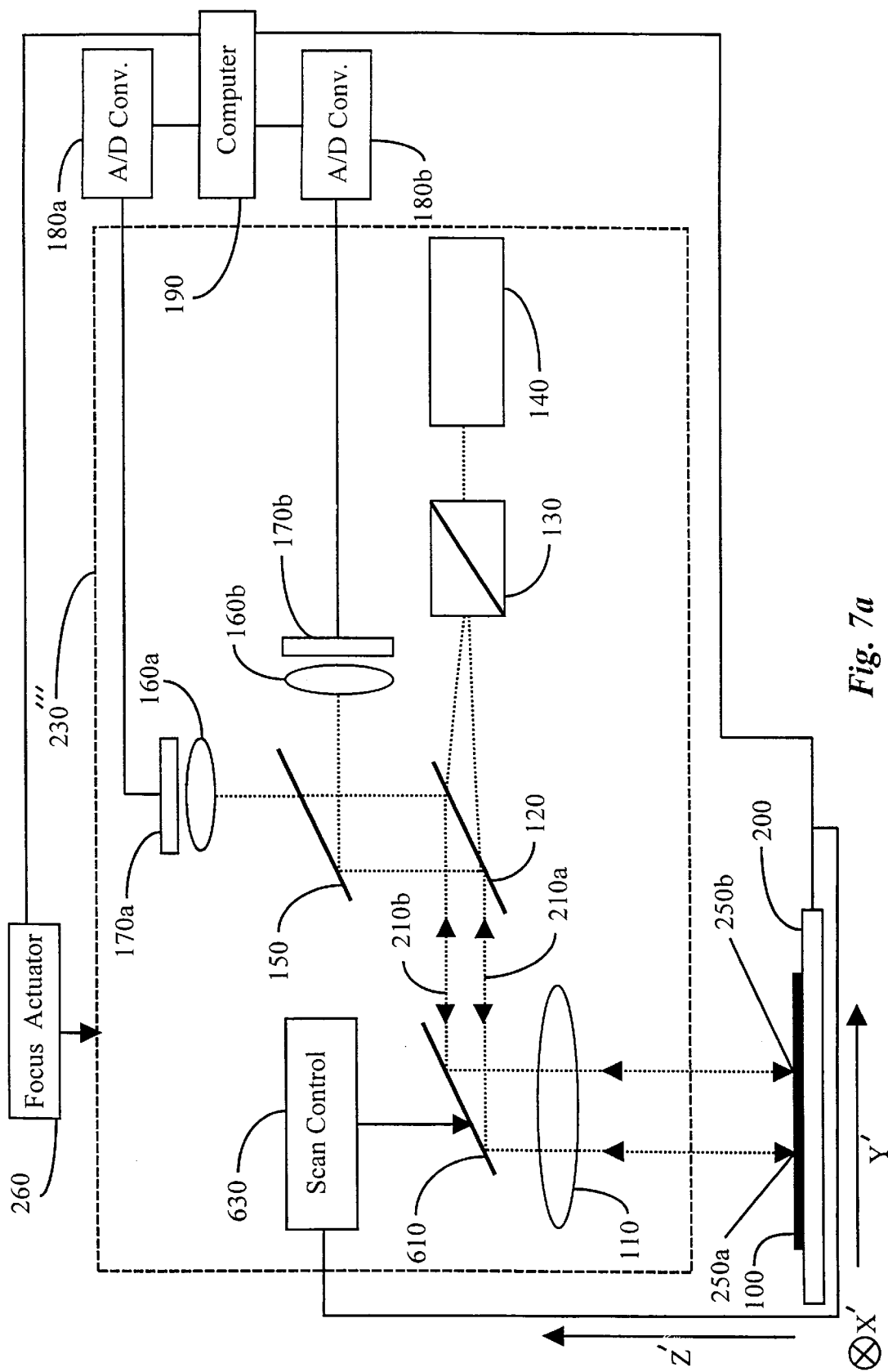
FIG. 7a illustrates a modified embodiment of an alignment system of the present invention wherein the light beam scanning is performned optically by means of a rotating mirror.

Referring now to FIG. 7a where a rotating mirror modification is shown for the embodiment of FIG. 2. In FIG. 7a, a side view of scan head 230" of FIG. 2 is shown where in this view the y'-axis is horizontal in the plane of the figure, while the x' axis is into the plane of the figure, and the z' axis is vertical as it is in FIG. 2. The components that are the same as in FIG. 2, function in the same way as discussed above with respect to FIG. 2, are shown here with the same reference numbers. Beamsplitter 120 in FIG. 7a is rotated 90° relative to its orientation in FIG. 2 allowing all of the instrument elements to be shown. Both arrangements (FIGS. 2 and 7a) are correct, as the choice of the direction of the return beams (determined by the orientation of beamsplitter 120) is not material and is usually determined only by convenience.

There are several additional components shown in FIG. 7a that were not shown in FIG. 2. In this embodiment, rather than moving scan head 230' or stage 200 in the direction of the y' axis, the light beams to and from wafer 100, from and to beam splitter 120 are reflected by mirror 610. Additionally, mirror 610 is rotated through a small angle by scan control 630 (e.g., a servo), about an axis of rotation that is parallel to the x'-axis, under control of computer 190. That rotation of mirror 610 thus causes the two light beams from beam splitter 120 to scan across wafer 100 in the direction of the y' axis.

Figure 7B:
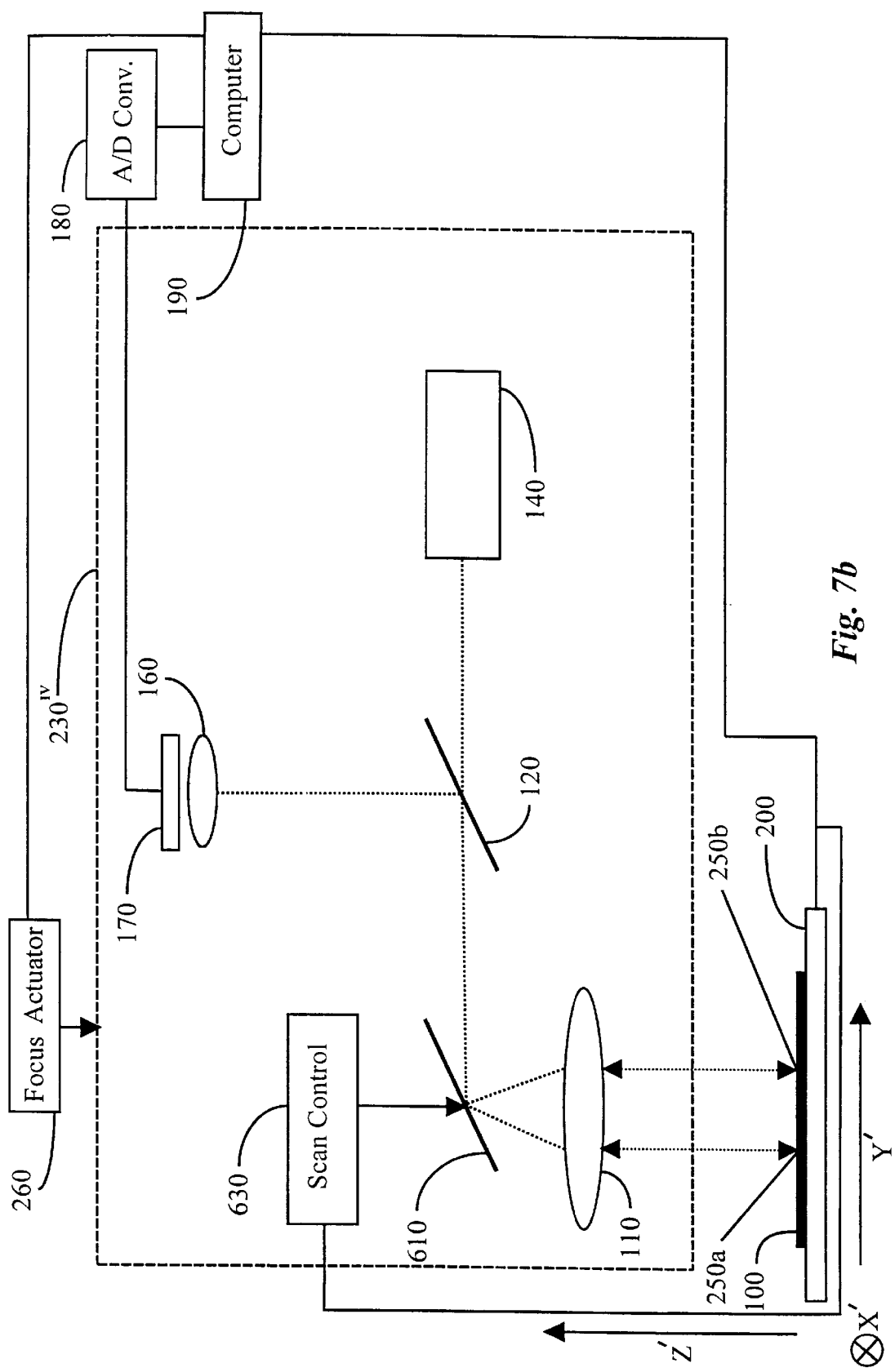
FIG. 7b illustrates a time-division multiplexed implementation with a single light source and two movable mirrors.

The embodiment of FIG. 7a can also be modified to operate with only one beam, as illustrated in FIG. 7b, where light from source 140 is scanned by mirror 610 along the measurement axis y' (as before). By rotating mirror 610 in the orthogonal direction, x', the beam can be directed alternately from one scan path to the other (e.g., the scan paths of beams 250a and 250b in FIG. 3). Since only one beam is used, there is only one detector (170) to produce the signals. Compared to the two beam embodiment, the signal processing requires an additional step: the time delay between the consecutive alternate scans needs to be subtracted from the second scan time axis, so that the signals can be represented on the same time axis as in FIG. 4. This single beam scanning does not have the advantage of common mode rejection of vibration induced errors.

There are other well-known optical scanning methods, such as those presented in the literature (See *Laser Beam Scanning* by Gerald F. Marshall, Marcel Dekker, Inc., 1985) and include rotating prisms, rotating multifaceted mirrors and acousto-optic deflectors. Any of those may be adapted to perform similarly to the performance discussed with relation to FIGS. 7a and 7b.

The previously described embodiments of FIGS. 2, 7a, and 7b each use a linear scan (i.e., the beams are moved at a constant velocity). In some applications, it may be advantageous to employ a varying velocity scan. In particular, a sinusoidal velocity scan may be used, because it is easily generated by driving the scan mechanism in an oscillating fashion. The resulting signals are frequency modulated by the sinusoidal scan. The implementation of the sinusoidal scan does not require any modification to the apparatus as described in FIG. 2 or FIG. 7a, it is different only in that computer 190 is programmed to produce sinusoidal scan commands rather than linear to control scan actuator 240.

Additionally, there are well known signal processing methods for extracting relative phase information from frequency modulated signals. One approach that uses the ratio of the amplitude of the fundamental and first harmonic frequency components of the signal to measure the phase is described by Noah Bareket and Wayne W. Metheny in "Phase Modulated Polarizing Interferometer" U.S. Pat. No. 4,480,916.

Further, there are alternative methods for generating the two spot illumination 250a and 250b that may be advantageous in certain applications. The advantage may be in lower -implementation cost, and is application dependent.

Figure 6A:
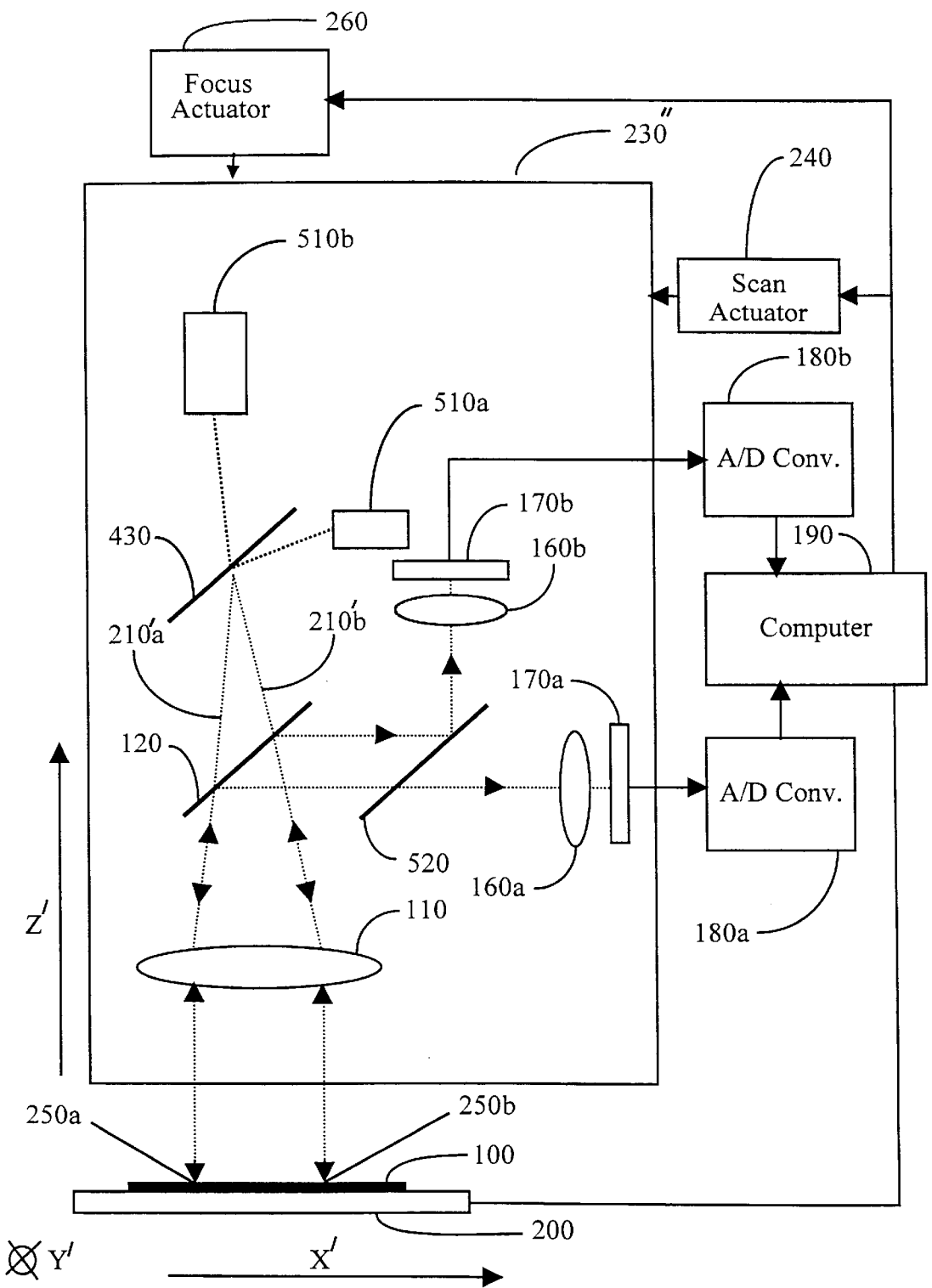
FIG. 6a illustrates a further embodiment of an alignment measuring system of the present invention wherein the light beam sources are multiplexed spectrally.
Figure 6B:
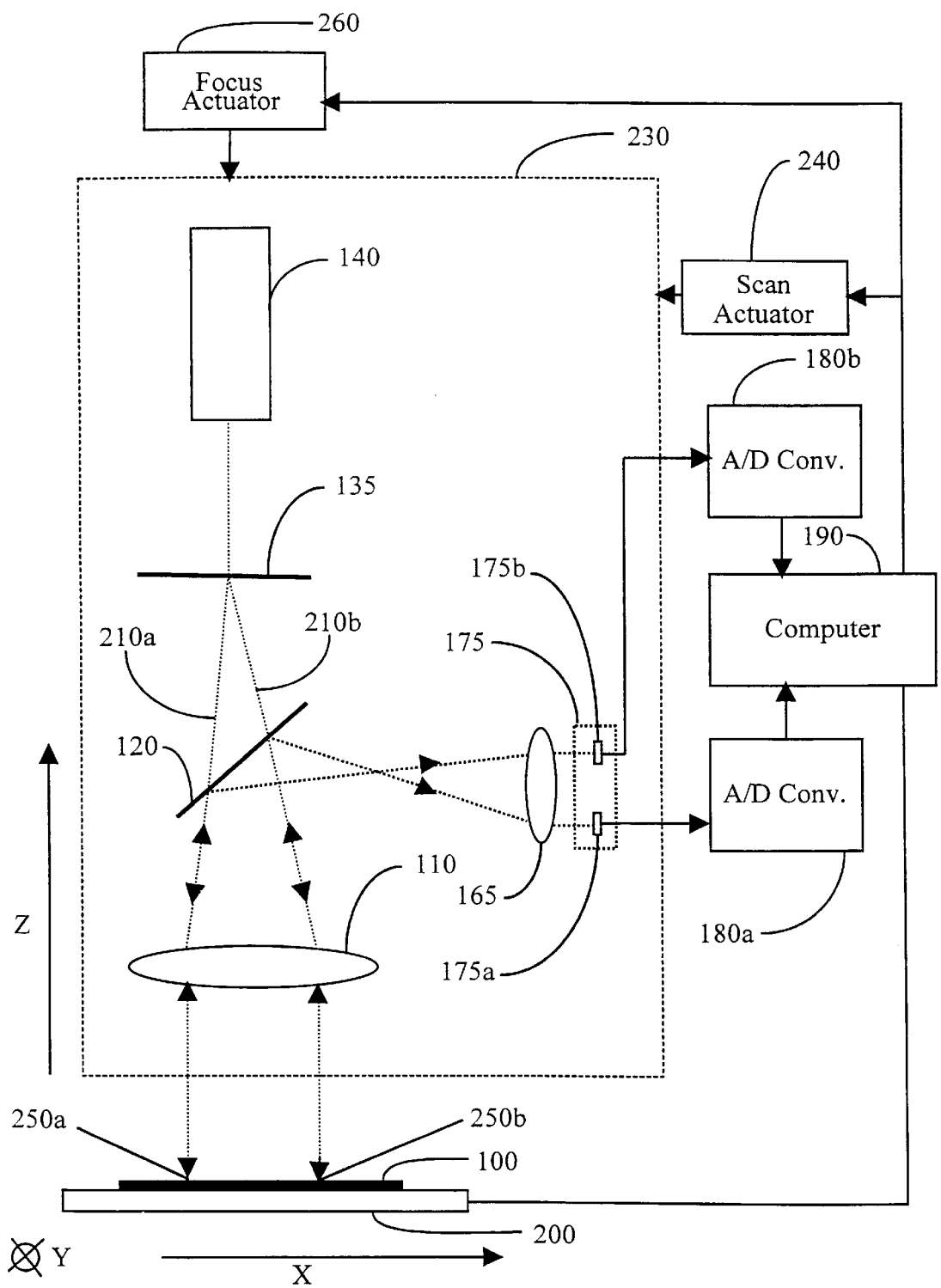
FIG. 6b illustrates an embodiment of the alignment measuring system of the present invention wherein the light beam sources are detected by adjacent detector elements.

One such alternative is illustrated in FIG. 6b which incorporates a diffraction grating to split the light into the required two beams. In this embodiment, diffraction grating 135 replaces prism 130 of the embodiment in FIG. 2. The grating 135 is composed of equally spaced lines of opaque coating on a glass substrate, creating a common optical element that is known as a Ronchi Ruling. A discussion of the properties of such gratings can be found in *Modern Optical Engineering* by Warren J. Smith, McGraw-Hill, 1990, page 154. The first diffraction orders are separated by an angle a, given by the equation $\sin \alpha = 2\lambda/S$, where $\lambda$ is the illumination wavelength and S is the grating period. The two first diffraction orders are used to provide the two illumination beams 210a and 210b. As before, the reflected light from wafer 100 is directed by beam splitter 120 toward detector 175. To separate the two beams, they are imaged by lens 165 on detector 175, which comprises two detecting elements, 175a and 175b, as shown in FIG. 6b. The signals of each element are digitized by the corresponding A/D converter (180a and 180b), and acquired by computer 190 as previously discussed. The non-diffracted zero order light is focused in between the detector elements and does not interfere with the measurement.

Figure 5A:
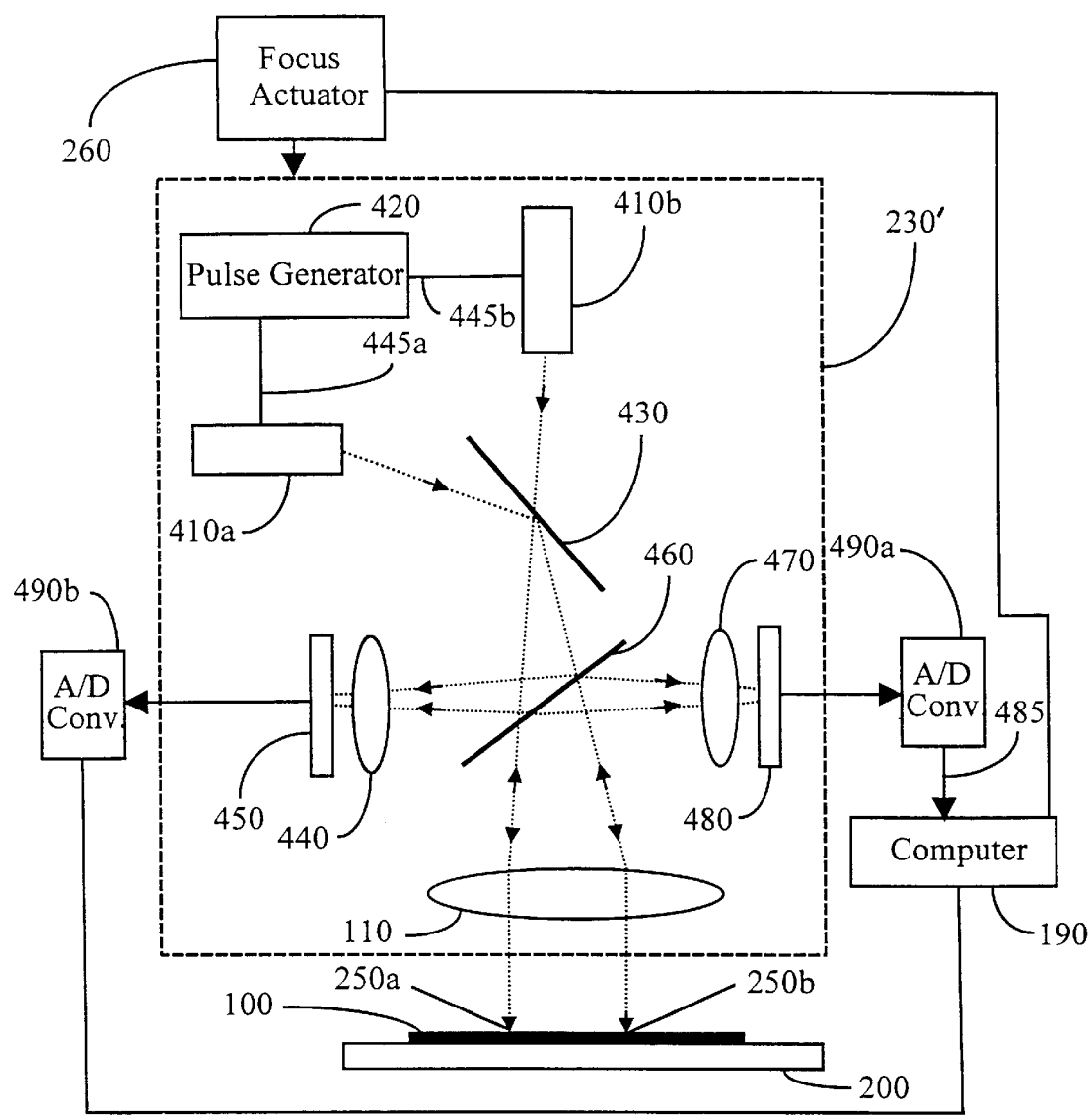
FIG. 5a illustrates another embodiment of an alignment measuring system of the present invention that utilizes time-division multiplexing.
Figure 5B:
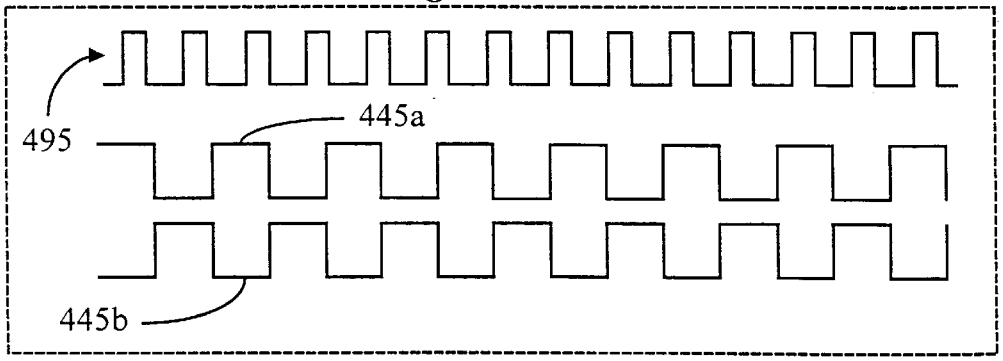

The embodiment of FIG. 5a incorporates a time division multiplexing approach in scan head 230' where illumination points 250a and 250b are alternately illuminated. Here scan head 230' includes pulse generator 420 that controls laser diodes 410a and 410b located symmetrically about the optical axis and on approximately the same y'-coordinate of scan head 230'. To alternatively power laser diodes 410a and 410b, pulse generator 420 produces reciprocal square waves 445a and 445b (i.e., 180° out of phase with each other) as shown in FIG. 5b. The pulsing light beams from each of laser diodes 410a and 410b, in turn, are directed to substantially the same point on opposite sides of beam splitter 430 where the two light beams are separated and directed toward illumination points 250a and 250b on wafer 100. The two separated pulsing light beams from beam splitter 430 are then directed to beam splitter 460 where some of the light from each of the two beams is reflected towards lens 440 which focuses that light on detector 450, while the balance of the light of each beam passes through beam splitter 460 and proceeds to objective lens 110 and then to illumination spots 250a and 250b on wafer 100 as in the first embodiment discussed in relation to FIG. 2 (i.e., since the two light beams are pulsing 1800 out of phase from each other, illumination points 250a and 250b in this embodiment are not both illuminated at the same time). The light reflected from each of illumination points 250a and 250b on wafer 100 in turn is reflected back through lens 110 to beam splitter 460 and is deflected to lens 470 where the light is focused on detector 480.

The analog signals that are generated by detectors 450 and 480 are applied to A/D converters 490b and 490a, respectively. Each of detectors 490a and 490b are strobed by pulse train 495 (see FIG. 5b), which is double the frequency of and synchronized with pulse trains 445a and 445b, under control of computer 190. The strobing of A/D converters 490a and 490b with waveform 495 separates the data contributed by each of the pulsed light beams produced by pulsed laser diodes 410a and 410b before that data is handed off to computer 190.

In this configuration detector 450 detects the light waveforms directed toward wafer 100, while detector 480 detects the light waveforms reflected from wafer 100. With the data from A/D converter 490b used for optimization by normalizing the values derived from A/D converter 490a (i.e., to compensate for a variation of intensity of laser diodes 410a and 410b), thus, theoretically, lens 440, detector 450, and A/D converter 490b could have been omitted.

FIG. 6a illustrates another embodiment of the present invention that uses two light sources and spectral multiplexing. Since the optical system of scan head 230" for this technique is quite similar to the approach of FIG. 2, the components that are the same and which function in the same way have the same reference numbers as in FIG. 2. In this embodiment the illumination sources are laser diodes 510a and 510b that emit light of a different wavelength from the other so that the light reflected from wafer 100 can be separated by virtue of the differences in wavelength. In the optical path, beam splitter 430 combines the light from the two sources, which are oriented so that the combined beams propagate with the required angular separation to produce the two illuminating beams 210a and 210b.

In FIG. 6a, the light reflected from wafer 100 and then reflected by beam splitter 120 is directed to a third beam splitter 520 which is of a dichroic type that transmits light of one wavelength (corresponding to the wavelength of one laser source), and reflects light of the other wavelength. The light from the spots 250a and 250b are thus separated by virtue of the difference in wavelength. From this point on the embodiment of FIG. 6a functions in an identical way to the embodiment of FIG. 2. This portion of the embodiment of FIG. 6a being substantially the same as that of FIG. 2, causes the calculation of the misalignment between the two layers on wafer 100 to be calculated in the same way as described with respect to FIG. 2.

Each of the embodiments discussed above use light for the measurement, however, in certain circumstances it can be advantageous to perform the measurement with another form of radiation, or an atomic scale microscope. In particular, another radiation approach that is most suitable is a scanning electron microscope, where the scanning electron beam can be programmed to scan the target 10 on wafer 100. Any one of the many commercially available scanning electron microscopes (e.g., KLA Model 8100) can perform the measurement without modification. In such an implementation, the microscope is programmed to scan the two portions of the target on the different semiconductor layers alternatively. The computer system of the microscope then stores the signals obtained by scanning, which are essentially similar to the signals obtained by the previously described embodiments, and once the signals are acquired, they are processed by the computer in essentially the same way as in the prior embodiments. Because the scan speed of an electron microscope is very high, the accuracy of the measurement is not degraded by any vibrations that might be present even though the two scans are performed serially.

Figure 8:
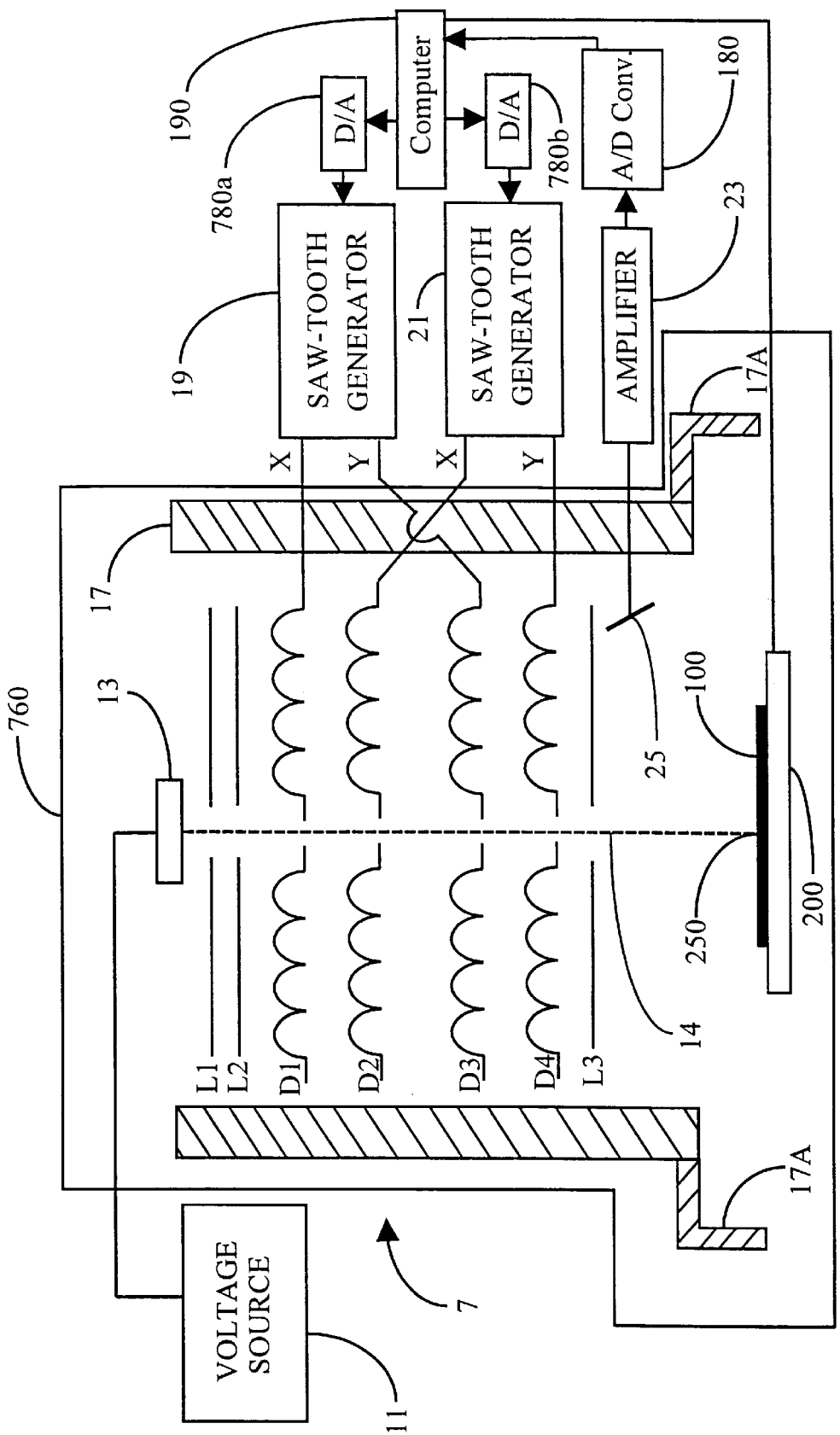
FIG. 8 illustrates a scanning electron microscope implementation of the present invention.

FIG. 8 is a schematic representation of a scanning electron-beam implementation of the present invention. Included within vacuum chamber 760 is scanning electron-beam microscope 7 within an electron optical column 17 above wafer 100 on stage 200 which is located within lower chamber 17a. In the simplified schematic of the electron-beam microscope 7, shown here is electron source 13 that is connected to external voltage source 11 with a narrow beam of highly accelerated electrons 14 emanating from electron source 13 that is directed toward wafer 100.

In the path between electron source 13 and wafer 100 are a plurality of electron lens $L_1$, $L_2$, and $L_3$ to focus the electron beam on wafer 100. Intermediate lens $L_2$ and $L_3$, there is also shown an electrostatic deflection system to selectively scan electron beam 14 across the surface of wafer 100. As shown here the deflection system includes four pairs of electron beam scanning coils $D_1$, $D_2$, $D_3$, and $D_4$. With deflection coils $D_1$, $D_2$, $D_3$, and $D_4$ beam 14 can be deflected to serially scan across the surface of wafer 100 in selected x axis and y axis paths for the purposes of the present invention to gather data from beams 250a and 250b (in each of the x and y axis scans) as in FIG. 3. In turn, deflection coils $D_1$, $D_2$, $D_3$, and $D_4$ are controlled by computer 190 via digital-to-analog (D/A) converters 780a and 780b and sawtooth generators 19 and 21.

As beam 14 is scanned across wafer 100, and target 30 (not shown) thereon, secondary and backscatter electrons from wafer 100 are detected by electron collector 25. The signal made up of the detected electrons from electron collector 25 is then applied to amplifier 23 and then to computer 190 via A/D converter 180. Thus, as in the other embodiments discussed above where the scans are performed serially, computer 190 analyzes the data here in the same way. Of the serial scanning embodiments of the present invention, the scanning electron microscope embodiment just discussed is superior since it is very fast and therefore less likely to be impacted by vibrations which might have a serious impact on the accuracy of a traditional optical embodiment.

Other embodiments that might be used are those that are able to mechanically detect the microscopic differences in height of features on a wafer. Some devices having that capability are Atomic Force Microscopes (ATM), Scanning Tunneling Microscopes (STM), Near-Filed Optical Microscopes, etc. This general field of the art was the topic of a conference on Scanning Probe Microscopy by the American Institute of Physics at Santa Barbara, Calif., in 1991 recorded in the API Conference Proceedings 241, "Scanning Probe Microscopy", H. Kumar Wickramasinghe, Editor.

Figure 9:
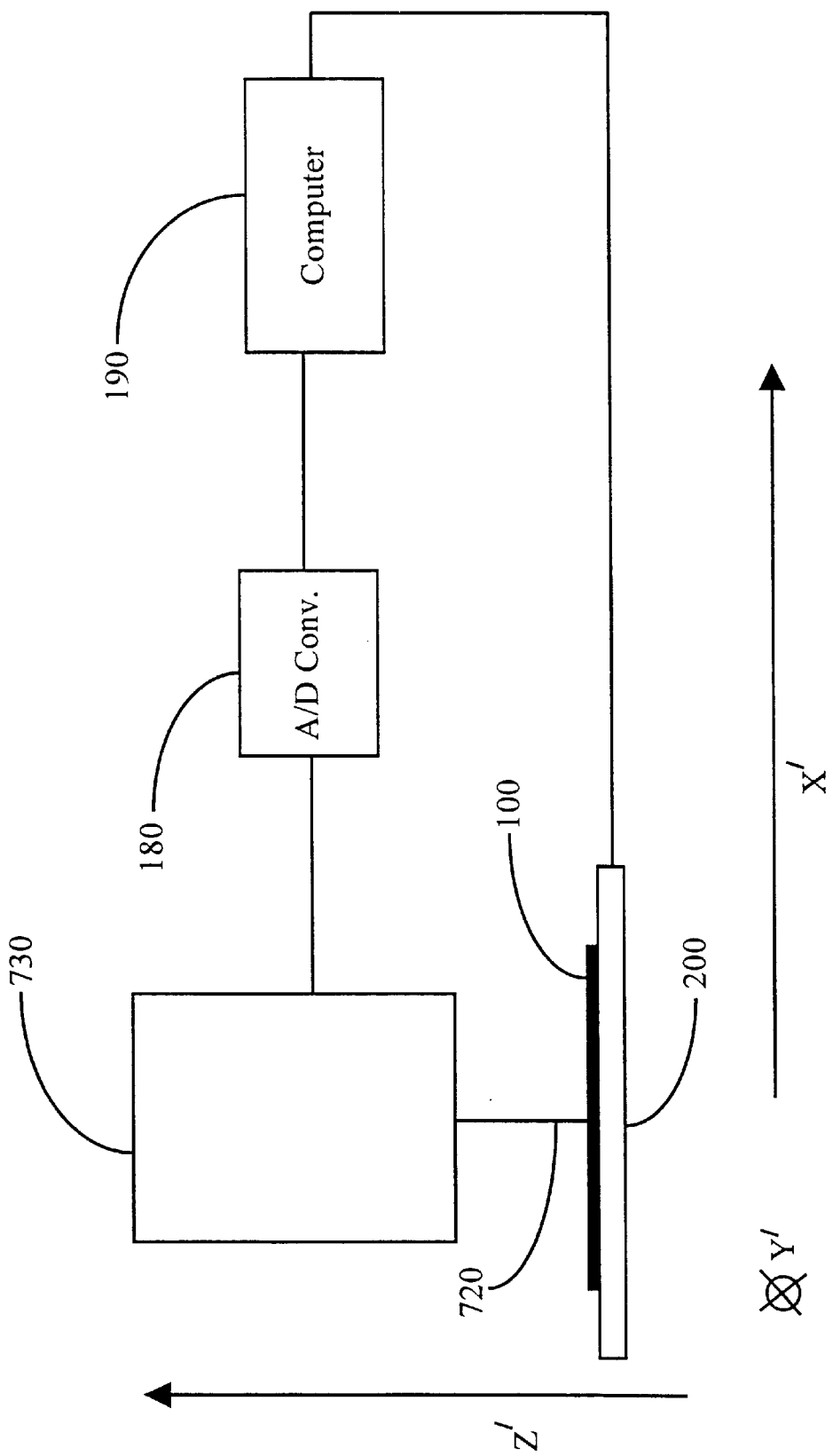
FIG. 9 illustrates an embodiment utilizing atomic force detection techniques to implement the present invention.

FIG. 9 illustrates how those techniques can be employed for the present invention in simplified schematic form. Wafer 100 to be scanned in shown on stage 200 with the positioning stage 200 under control of computer 190. The scanning probe hardware, including the necessary support electronics is shown as block 730 with probe 720 in communication with block 730. Thus, as probe 720 scans target 20 or 30 (not shown—see FIG. 16) on wafer 100 as stage 200 is translated in either the x or y direction, excursions of probe 720 in the z direction produce an analog electronic signal in the electronics within block 730 which is converted to a digital signal by A/D converter 180 and then applied to computer 190. Thus, it can be seen that the signal produced by the mechanical motion of probe 720 in the z direction is directly proportional to the optically detected differences in the previously discussed embodiments and therefore is processed similarly by computer 190. Here also, the user has the option of using multiple probes simultaneously as in the previous embodiments to have the effect of beams 250a and 250b, (See FIG. 10b) or of performing the scans serially as with the scanning electron microscope.

Figure 10A:
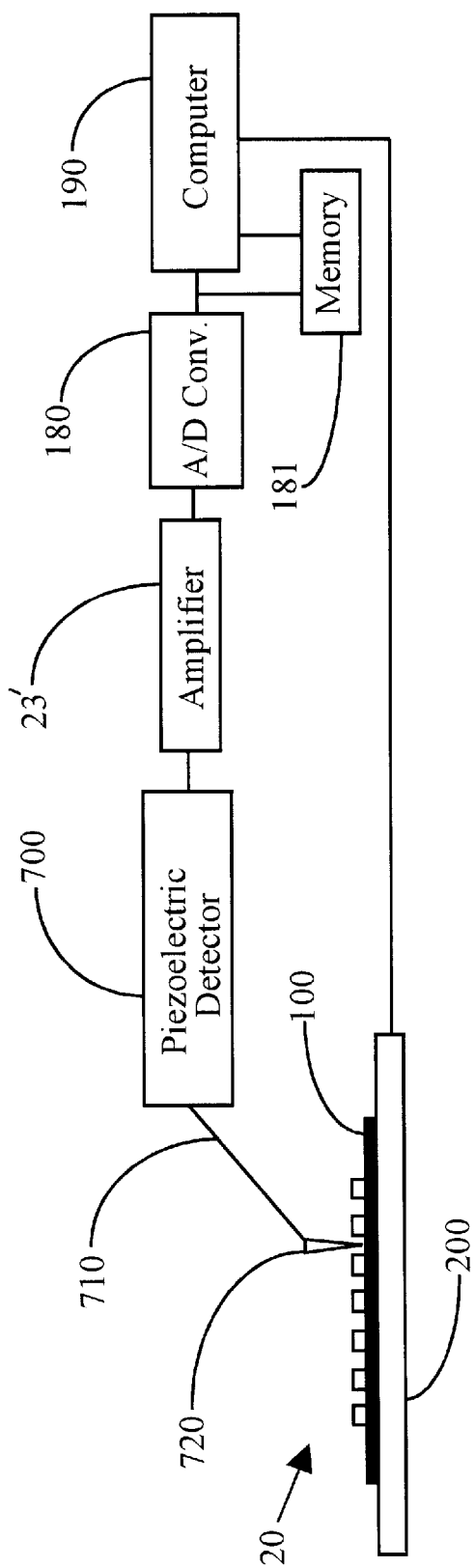
FIG. 10a and 10b more specifically illustrate an atomic force microscope embodiment of the present invention.
Figure 10B:
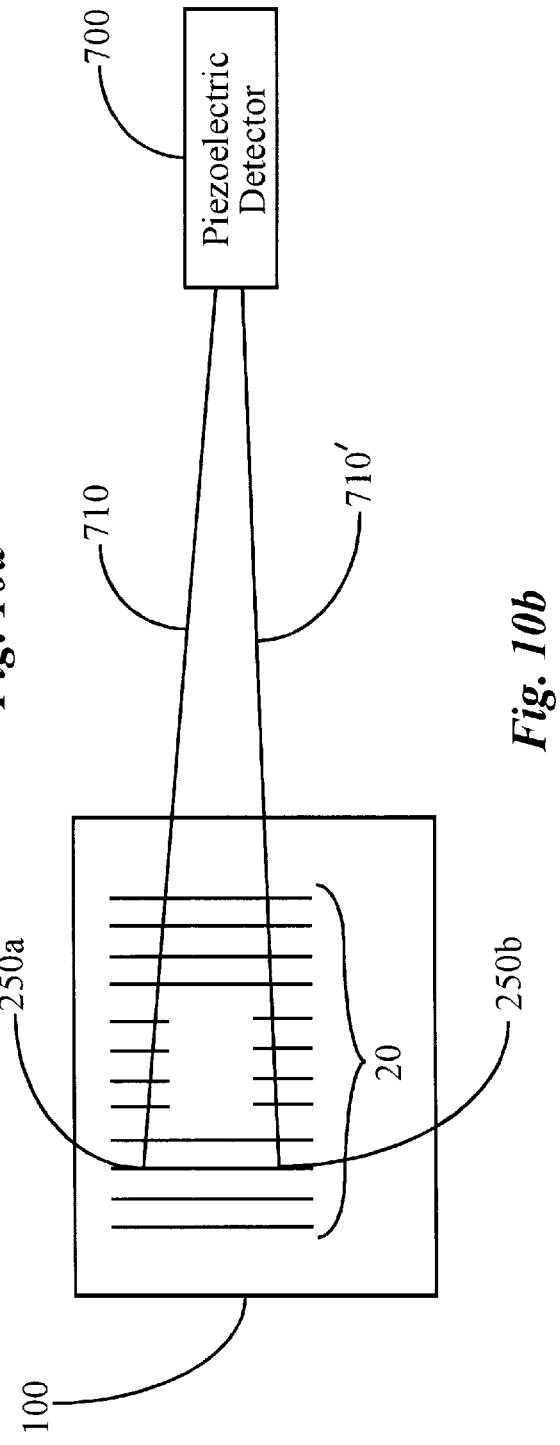

This embodiment is shown in somewhat more detail in FIGS. 10a and 10b with piezo driven cantilever 710 (a pair of cantilevers 710 and 710' in FIG. 10b) with an atomic sized tip 720 (e.g., single crystal of silicon). Here, as tip 720 is traversed across target pattern 20 on wafer 100 (as either wafer 100 is translated by computer 190 on stage 200, or as cantilever 710 is drawn across wafer 100), tip 720 is translated in the z direction by the lines and spaces between the lines of target 20. That vertical translation of tip 720 causes cantilever 710 to apply atomic force changes to the piezo crystal in piezoelectric detector 700 which generates a varying electrical signal by the piezo crystal in proportion to the angular deflection of cantilever 710. That electrical signal is then applied to amplifier 23' and then to computer 190, via analog/digital converter 180, where the analysis is the same as in other embodiments discussed above. Additionally, there is a memory 181 (e.g., RAM) connected to both A/D converter 180 and computer 190. Memory 190 is provided to store digital values of signals received from piezoelectric detector 700 that are proportional to height variations of tip 720 and the angular displacement of cantilever 710. With memory 181, the signal values can be stored for comparison by computer 190 with later received signal values from piezoelectric detector 700 for a different path across target 100 to determine any offset between two periodic structures of target 100.

While this invention has been described in several modes of operation and with exemplary routines and apparatus, it is contemplated that persons skilled in the art, upon reading the preceding descriptions and studying the drawings, will realize various alternative approaches to the implementation of the present invention. It is therefore intended that the following appended claims be interpreted as including all such alterations and modifications that fall within the true spirit and scope of the present invention.

What is claimed:

1. An apparatus to determine the relative position between two layers of a device, wherein a second layer of said two layers is located above a first layer of said two layers utilizing a target including a first periodic structure on said first layer of said device and a second periodic structure that complements said first periodic structure with said second periodic structure on said second layer of said device at a location that is adjacent said first periodic structure, said apparatus comprising:

a microscopic height variation detector in communication with said target on said device, said microscopic height variation detector including:
  a stylus having:
    an atomic sized tip in communication with said target on said device; and
    a cantilever arm having distal and proximate ends thereof with said atomic sized tip affixed to said distal end thereof; and
  an angular deflection detector affixed to said proximate end of said stylus to develop an electrical signal directly proportional to vertical displacement of said atomic sized tip of said stylus;

a translational system coupled to said microscopic height variation detector and said device to provide movement therebetween with said atomic sized tip addressing a selected path on said device;

a memory coupled to said angular deflection detector to store electrical signals therefrom as said atomic sized tip traverses said device for comparison with later received electrical signals produced when said atomic sized tip traverses a different path across said device under control of said translational system to calculate any offset between said first and second periodic structures of said target; and a computing and control system coupled to said translational system to cause said atomic sized tip to traverse across said target on said device and to sequentially vary the path of said atomic sized tip across said surface of said device in two such paths, and coupled to receive signals from said angular deflection detector and said memory to calculate any offset between said first periodic structure and said second periodic structure of said target with two electrical signals, one from each of said angular deflection detector and said memory.

2. An apparatus to determine the relative position between two layer of a device, wherein a second layer of said two layers is located above a first layer of said two layers, said apparatus comprising:

a target including a first periodic structure on said first layer said first layer of said device and a second periodic structure that complements said first periodic structure with said second periodic structure on said second layer of said device at a location that is adjacent said first periodic structure;

a microscopic height variation detector positioned relative to said device to scan said target on said device and produce an electrical signal representative of height variations of said first and second periodic structures in a selected path across said device; and a computing and control system to provide translation between said microscopic height variation detector and said target on said device in a selected path, and to calculate any offset between said first periodic structure and said second periodic structure of said target from said electrical signals from said microscopic height variation detector.

3. The apparatus of claim 2, in said target:

each of said first and second periodic structures have a first portion of a first selected width, and a second portion of a second selected width with said second selected width being up to one-half said first selected width, said first portion of each of said first and second periodic structures includes two first line segments each having:
  a substantially uniform thickness, m; and
  a length that is substantially equal to said first selected width, with each of said first line segments being separated from adjacent first line segments by a substantially uniform distance n; and each of said second sections of each of said first and second periodic structures disposed to be adjacent a portion of each of said first section and second section of the other one of said first and second periodic structures, said second portion of each of said first and second periodic structures includes two second line segments each having:
  a substantially uniform thickness, m; and
  a length that is substantially equal to said second selected width, with each of said second line segments being separated from adjacent first and second line segments of the same periodic structure by a substantially uniform distance n; and wherein said computing and control system determines a time duration of each portion of said electrical signal representative of height variations of said first and second periodic structures from microscopic height variation detector to determine widths of, and spacings between, various adjacent line segments of said first and second periodic structures.

4. A method for determining the relative position between two layers of a device in a selected direction wherein a second layer of said two layers is located above a first layer of said two layers, said method comprising the steps of:

a. placing a first periodic structure of a target on said first layer of said device oriented to facilitate determination of said relative position between said two layers;

b. placing a second periodic structure of a target, wherein said second periodic structure complements said first periodic structure, at a location that is adjacent said first periodic structure and oriented similarly to the orientation of said first periodic structure in step a. to facilitate determination of said relative position between said two layers;

c. transversing an atomic sized tip in a first path across said first and second periodic structures of steps a. and b.;

d. transversing an atomic sized tip in a second path across said first and second periodic structures of steps a. and b.;

e. detecting vertical deflection of said atomic sized tip in said first path as the transversing of step c. is performed;

f. detecting vertical deflection of said atomic sized tip in said second path as the transversing of step d. is performed;

g. generating a first signal proportional to the intensity of the detected deflection in step e.;

h. generating a second signal proportional to the intensity of the detected deflection in step f.; and i. calculating any offset between said first periodic structure and said second periodic structure of said target from said signals generated in steps g. and h.

5. A method for determining the relative position between two layers of a device in a selected direction wherein a second layer of said two layers is located above a first layer of said two layers, said method comprising the steps of:

a. placing a first periodic structure of a target on said first layer of said device oriented to facilitate determination of said relative position between said two layers;

b. placing a second periodic structure of a target, wherein said second periodic structure complements said first periodic structure, at a location that is adjacent said first periodic structure and oriented similarly to the orientation of said first periodic structure in step a. to facilitate determination of said relative position between said two layers;

c. transversing a microscopic height variation detector in a selected path across said first and second periodic structures of steps a. and b. to produce an electrical signal representative of height variations of said first and second periodic structures in said selected path across said first and second periodic structures;

d. calculating any offset between said first periodic structure and said second periodic structure of said target from variations of said electrical signal generated in step c.

6. The method of claim 5, wherein in steps a. and b., each of said first and second periodic structures have a first portion of a first selected width, and a second portion of a second selected width with said second selected width being up to one half said first selected width, said first portion of each of said first and second periodic structures includes two first line segments each having:

a substantially uniform thickness, m; and a length that is substantially equal to said first selected width, with each of said first line segments being separated from adjacent first line segments by a substantially uniform distance n; and each of said second sections of each of said first and second periodic structures disposed to be adjacent a portion of each of said first section and second section of the other one of said first and second periodic structures, said second portion of each of said first and second periodic structures includes two second line segments each having:

a substantially uniform thickness, m; and a length that is substantially equal to said second selected width, with each of said second line segments being separated from adjacent first and second line segments of the same periodic structure by a substantially uniform distance n; and step d. includes determining a time duration of each portion of said electrical signal representative of height variations of said first and second periodic structures from said microscopic height variation detector to determine widths of, and spacings between, various adjacent line segments of said first and second periodic structures.

* * * * *